United States Patent
Koga

(10) Patent No.: US 8,384,900 B2
(45) Date of Patent: Feb. 26, 2013

(54) EXPOSURE APPARATUS

(75) Inventor: Shinichiro Koga, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 478 days.

(21) Appl. No.: 12/582,979

(22) Filed: Oct. 21, 2009

(65) Prior Publication Data

US 2010/0104960 A1    Apr. 29, 2010

(30) Foreign Application Priority Data

Oct. 22, 2008   (JP) ................................ 2008-271783

(51) Int. Cl.
  *G01B 11/00*    (2006.01)
  *G01N 21/86*    (2006.01)
  *G03B 27/32*    (2006.01)
  *G03F 9/00*     (2006.01)

(52) U.S. Cl. ............ 356/401; 250/548; 355/77; 430/22; 430/30

(58) Field of Classification Search .................. None
See application file for complete search history.

(56) References Cited

U.S. PATENT DOCUMENTS

| | | | | |
|---|---|---|---|---|
| 5,493,402 A * | 2/1996 | Hirukawa | ...................... | 356/400 |
| 5,543,921 A * | 8/1996 | Uzawa et al. | ................. | 356/401 |
| 5,561,606 A * | 10/1996 | Ota et al. | ........................ | 716/55 |
| 5,563,788 A * | 10/1996 | Yoon | ............................. | 701/33.4 |
| 5,585,925 A * | 12/1996 | Sato et al. | ....................... | 356/401 |
| 5,602,400 A * | 2/1997 | Kawashima | .................. | 250/548 |
| 5,798,195 A * | 8/1998 | Nishi | .............................. | 430/22 |
| 5,805,866 A * | 9/1998 | Magome et al. | ................ | 716/51 |
| 6,278,957 B1 * | 8/2001 | Yasuda et al. | ................. | 702/150 |
| 6,342,703 B1 | 1/2002 | Koga et al. | | |
| 6,481,003 B1 * | 11/2002 | Maeda | ............................. | 430/22 |
| 6,699,630 B2 * | 3/2004 | Ota | ................................. | 430/30 |
| 7,006,226 B2 * | 2/2006 | Yamamoto | ..................... | 356/401 |
| 7,170,603 B2 * | 1/2007 | Katayama | ..................... | 356/399 |
| 7,190,456 B2 * | 3/2007 | Yamamoto | ..................... | 356/401 |
| 7,212,286 B2 * | 5/2007 | Hoshi | ............................ | 356/401 |
| 7,728,953 B2 * | 6/2010 | Suzuki et al. | .................... | 355/55 |
| 2004/0126004 A1 * | 7/2004 | Kikuchi | ........................ | 382/141 |
| 2006/0040191 A1 * | 2/2006 | Okita | ............................. | 430/22 |
| 2006/0050274 A1 * | 3/2006 | Matsumoto et al. | .......... | 356/401 |
| 2007/0109524 A1 * | 5/2007 | Kawakubo et al. | ............. | 355/77 |
| 2007/0133864 A1 * | 6/2007 | Morimoto | ..................... | 382/151 |

FOREIGN PATENT DOCUMENTS

| | | | |
|---|---|---|---|
| EP | 1804278 A1 * | 7/2007 | |
| JP | 10079339 A * | 3/1998 | |
| JP | 2000-133579 A | 5/2000 | |
| JP | 2007-129056 | 5/2007 | |

OTHER PUBLICATIONS

JP Office Action issued Dec. 25, 2012 for corresponding JP2808-271783 (English Translation provided).

* cited by examiner

*Primary Examiner* — Gordon Stock, Jr.

(74) *Attorney, Agent, or Firm* — Rossi, Kimms & McDowell LLP

(57) ABSTRACT

An exposure apparatus includes a controller configured to calculate a position of an alignment mark detected by a detector, to approximate a deformation of a substrate by using an approximation equation, to calculate a correction amount of each of the plurality of shots, and to control driving of a stage in exposing each shot based on a correction amount that is calculated. The approximation equation is defined as a sum of a first term representative of a deformation of the entire substrate, and at least one of a second term representative of a distortion of a shot arrangement and a third term representative of a shot shape.

8 Claims, 13 Drawing Sheets

| PATTERN APPROXIMATION METHOD | EXPOSURE APPARATUS THAT HAS EXPOSED KNOWN PATTERN | |
|---|---|---|
| | STEPPER | SCANNER |
| SUBSTRATE DEFORMATION (X) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |
| SUBSTRATE DEFORMATION (Y) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |
| SHOT CENTER DEFORMATION (X) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |
| SHOT CENTER DEFORMATION (Y) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |
| SHOT SHAPE DEFORMATION (X) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |
| SHOT SHAPE DEFORMATION (Y) | NONE<br>LINEAR EXPRESSION<br>QUADRATIC EXPRESSION<br>CUBIC EXPRESSION | NONE<br>LINEAR EXPRESSION<br>QUADRATIC EXPRESSION<br>CUBIC EXPRESSION |

FIG. 15

EXPOSURE APPARATUS

BACKGROUND OF THE INVENTION

1. Field of the Invention

The present invention relates to an exposure apparatus.

2. Description of the Related Art

A global alignment is one known alignment method for an exposure apparatus. The conventional global alignment measures alignment marks of sample shots allocated to a plurality of transfer areas (shots) on a substrate, then calculates a deformation of each sample shot by approximating a measurement value using a linear polynomial, and finally calculates deformations of all shots utilizing the calculated deformation of each sample shot.

While the shift, magnification and rotation of the substrate are corrected by using the result of the conventional global alignment, Japanese Patent Laid-Open No. 2000-133579 proposes a method that includes a correction of a shot shape.

A more precise global alignment is required for a higher resolution.

SUMMARY OF THE INVENTION

The present invention provides an exposure apparatus that can provide a highly precise global alignment.

An exposure apparatus is configured to expose an image of a pattern of an original onto each of a plurality of shots as a plurality of transfer areas on a substrate. The exposure apparatus includes a stage configured to support and drive the substrate, a detector configured to detect an alignment mark provided to each of a plurality of sample shots allocated to the plurality of shots, and a controller configured to calculate a position of the alignment mark detected by the detector, to approximate a deformation of the substrate by using an approximation equation, to calculate a correction amount of each of the plurality of shots, and to control driving of the stage in exposing each shot based on a correction amount that is calculated. The approximation equation is defined as a sum of a first term representative of a deformation of an entire substrate, and at least one of a second term representative of a distortion of a shot arrangement and a third term representative of a shot shape.

Further features of the present invention will become apparent from the following description of exemplary embodiments with reference to the attached drawings.

BRIEF DESCRIPTION OF THE DRAWINGS

FIG. 15 is an operation screen used to set an order of each term in an approximation equation used to approximate a deformation of the substrate according to the second embodiment.

DESCRIPTION OF THE EMBODIMENTS

Figure 2:
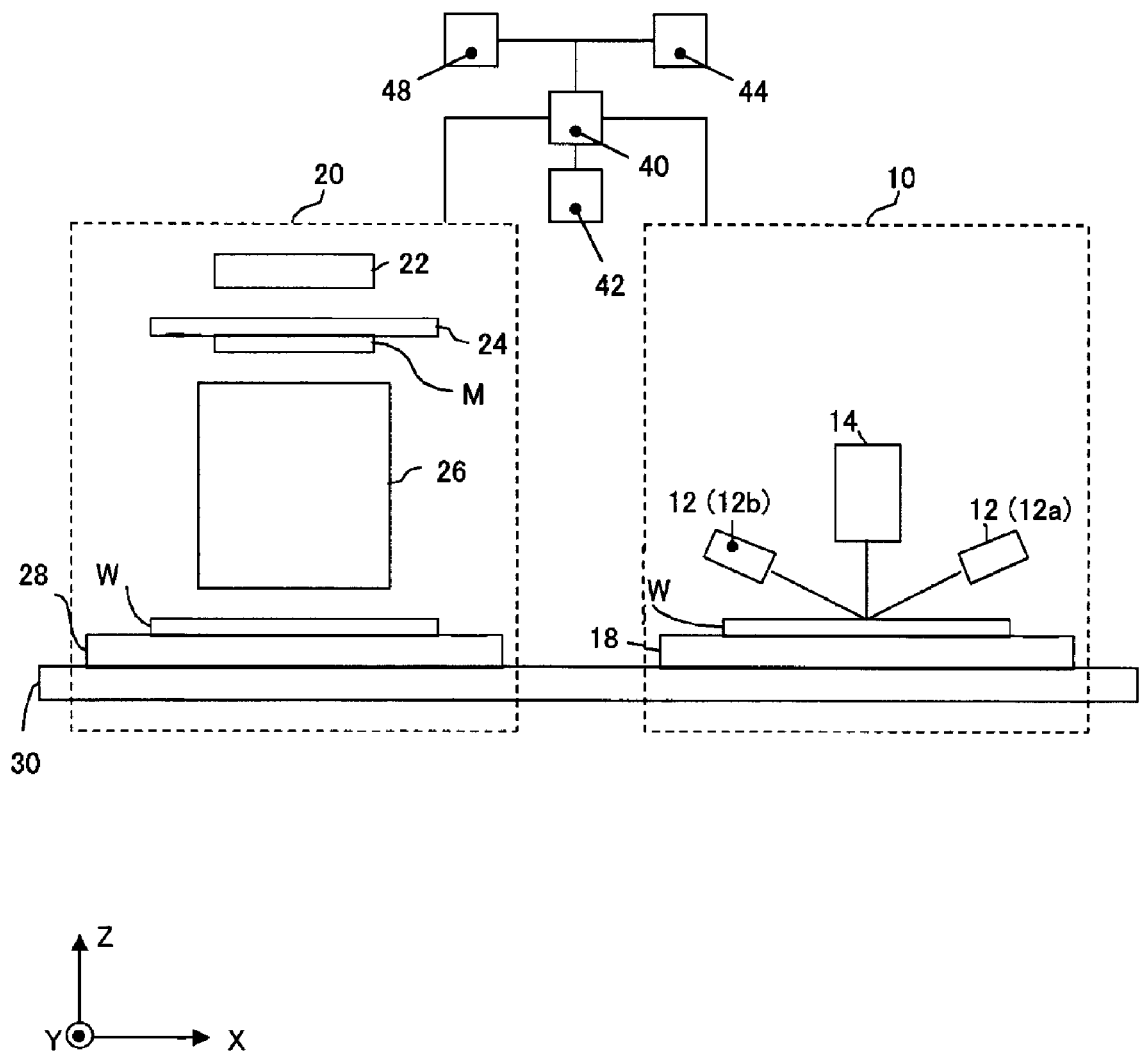
FIG. 2 is a block diagram of an exposure apparatus to which the present invention is applicable.

FIG. 2 is a block diagram of an exposure apparatus 60 according to this embodiment. The exposure apparatus 60 exposes an image of a pattern of an original (mask or reticle) M onto a substrate (wafer or liquid crystal substrate) W. In FIG. 2, a Y direction is a scanning direction, an X direction is a non-scanning direction orthogonal to the scanning direction, and a Z direction is a direction perpendicular to the XY plane and parallel to an optical axis direction of the projection optical system 26. Directions of rotational axes in the X-axis, Y-axis, and Z-axis are θX, θY and θZ directions.

The exposure apparatus 60 includes a measurement station 10, an exposure station 20, a support plate 30, and a controller 40. The present invention is applicable to an exposure apparatus in which the measurement station 10 and the exposure station 20 are undivided and integrated.

The measurement station 10 performs focusing and an alignment of the substrate W, and includes a focus detection system 12, a detector 14, and a stage 18.

The focus detection system 12 obtains positional information of a substrate surface (including positional information in the Z direction and inclination information). The focus detector 12 includes a light projection unit 12a configured to project detection light onto the substrate surface and a light receiving unit 12b configured to receive the reflected light from the substrate W. The detection result (measurement value) of the focus detection system 12 is output to the controller 40.

The detector 14 can detect and take an image of the alignment mark. The detection result (measurement value) of the detector 14 is output to the controller 40.

The stage 18 supports the substrate W. The stage 18 has a drive mechanism (not shown) configured to drive the stage 18 in a direction of each of the XYZ axes and in a direction around each of the XYZ axes. The drive mechanism is controlled by the controller 40.

The exposure station 20 exposes an image of the pattern of the original M onto the substrate W based on the result (focus information and alignment information) measured by the measurement station 10. The exposure station 20 of this embodiment uses a step-and-scan method that synchronously scans the original M and the substrate W and exposes the pattern of the original M onto the substrate W. However, the present invention allows the exposure station 20 to use a step-and-repeat method.

The exposure station 20 includes an illumination unit 22, an original stage 24, a projection optical system 26, and a stage 28.

The illumination unit 22 illuminates the original M, and includes a light source configured to emit a light beam as exposure light and an illumination optical system configured to uniformly illuminate the original M. A type of the light source is not limited, and the original M has a circuit pattern to be transferred.

The original stage 24 supports the original M. The original stage 24 has a drive mechanism (not shown) that provides two-dimensional movements on the XY plane and fine rotations in the θZ direction. The drive mechanism is controlled by the controller 40.

The projection optical system 26 maintains an optically conjugate relationship between the original M and the substrate W, and projects an image of the pattern of the original M onto the substrate W. A medium between the projection optical system 26 and the substrate W is not limited, such as air and a liquid.

The stage 28 supports the substrate W. The stage 28 has a drive mechanism (not shown) configured to drive the stage 28 in a direction of each of the XYZ axes and a direction around each axis. The drive mechanism is controlled by the controller 40.

The substrate W has a plurality of transfer areas (shots), and the pattern of the original M is transferred onto each shot.

Figure 3:
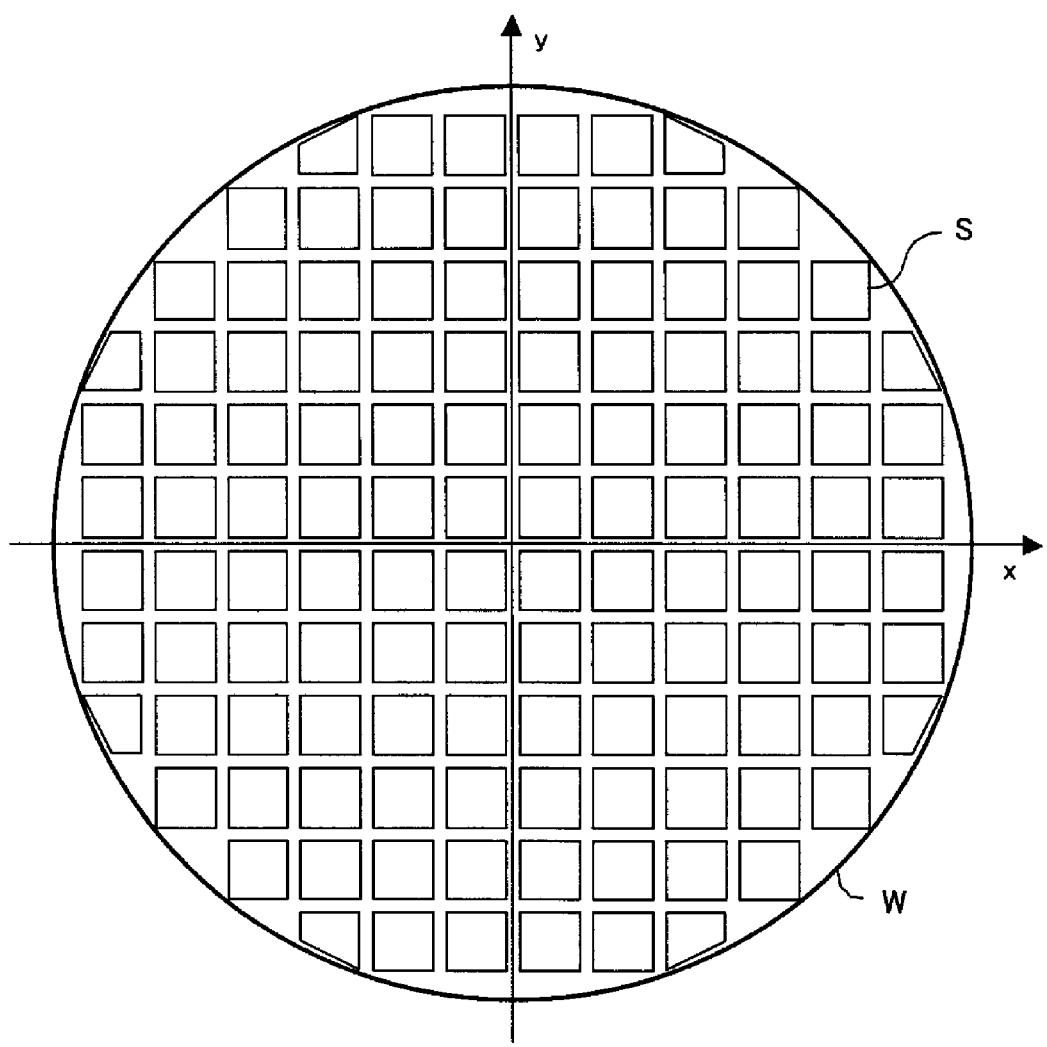
FIG. 3 is a plane view of a shot arrangement on a substrate shown in FIG. 2.

FIG. 3 is a plane view showing the arrangement of shots S on the substrate W. The coordinate system of FIG. 3 will be referred to as a "substrate coordinate system" hereinafter.

Figure 4:
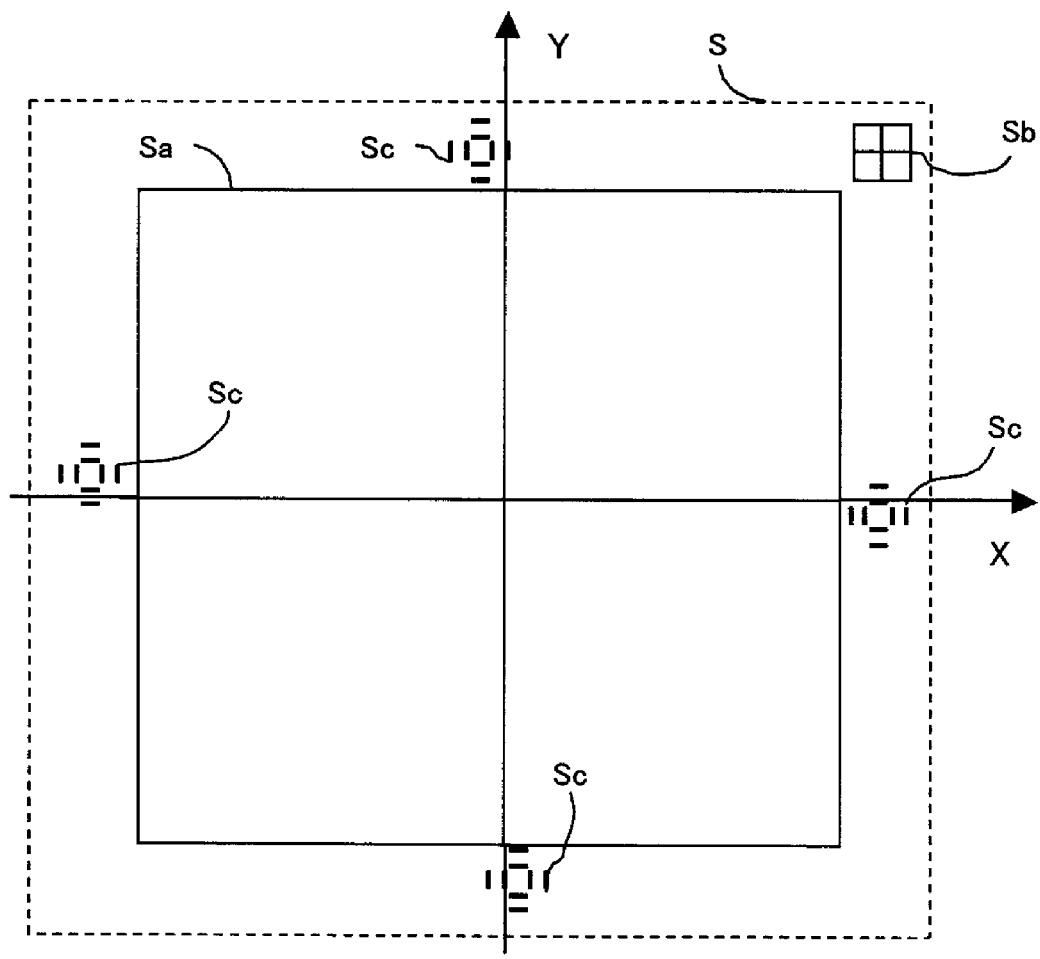
FIG. 4 is a schematically enlarged plane view of the shot shown in FIG. 3.

FIG. 4 is an enlarged plane view of one shot S. Sa denotes an area to be transferred (transfer area), Sb denotes a mark for a rough alignment, and Sc denotes a mark for a fine alignment. Thus, a plurality of alignment marks Sb and Sc are provided around the transfer area Sa of each shot S. A positional relationship (in the XY directions) between the alignment marks Sc and the transfer area Sa of the shot S is known. The coordinate system of FIG. 4 will be referred to as a "shot coordinate system" hereinafter. The number of alignment marks Sc is not limited to four.

The support plate 30 supports two stages 18 and 28 that can move between the measurement station 10 and the exposure station 20. The exposure apparatus of this embodiment has two stages, but the number of stages is not limited.

Figure 1:
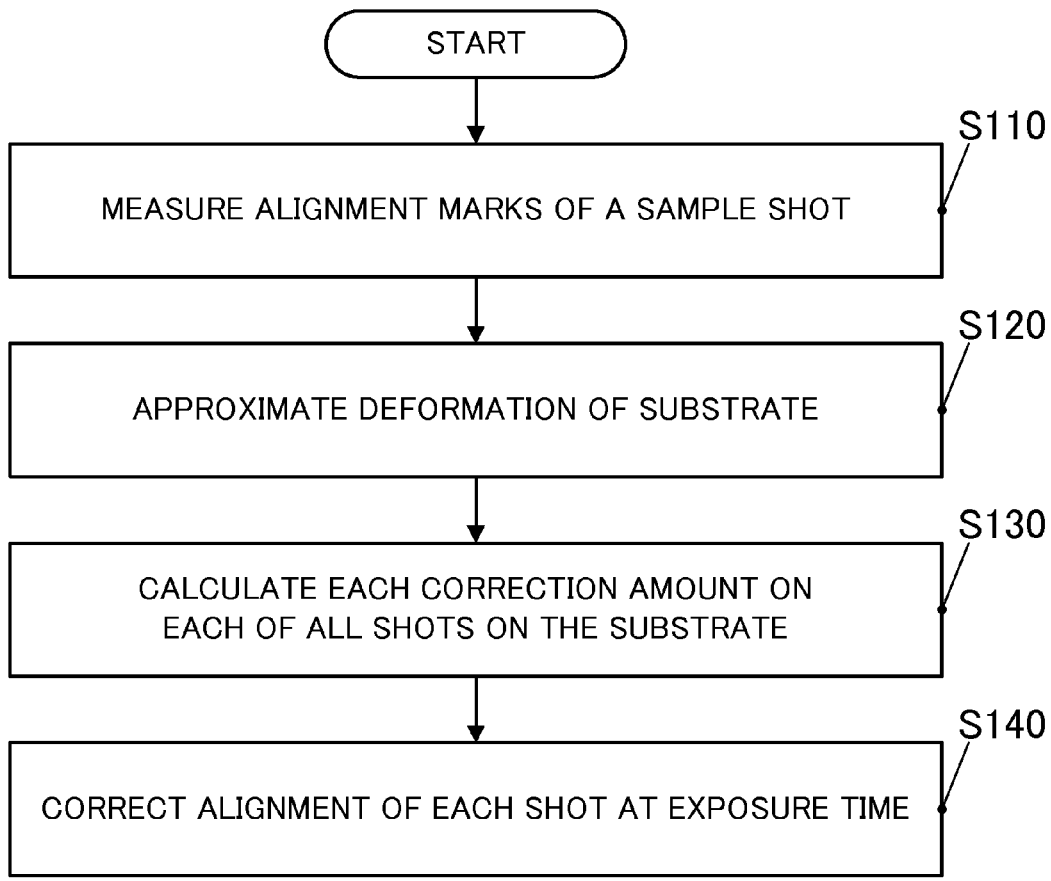
FIG. 1 is a flowchart for explaining an alignment method according to a first embodiment.

The controller 40 controls each component of the exposure apparatus, and executes a measurement and an exposure, particularly including an alignment method (exposure method) shown in FIG. 1. The controller 40 is connected to a memory 42, a display 44, and an input unit 48. The memory 42 stores information and a database and a program (software) necessary for the process of the controller 40. The display 44 displays an operation screen used for a user to set an operation of the exposure apparatus. The input unit 48 is a keyboard and a pointing device used for the user to input a variety of information into the exposure apparatus.

First Embodiment

Referring now to FIG. 1, a description will be given of an alignment method executed by the controller 40. FIG. 1 is a flowchart for explaining the alignment method of this embodiment. In FIG. 1 as well as another flowchart, "S" denotes an abbreviation of the step.

Figure 5:
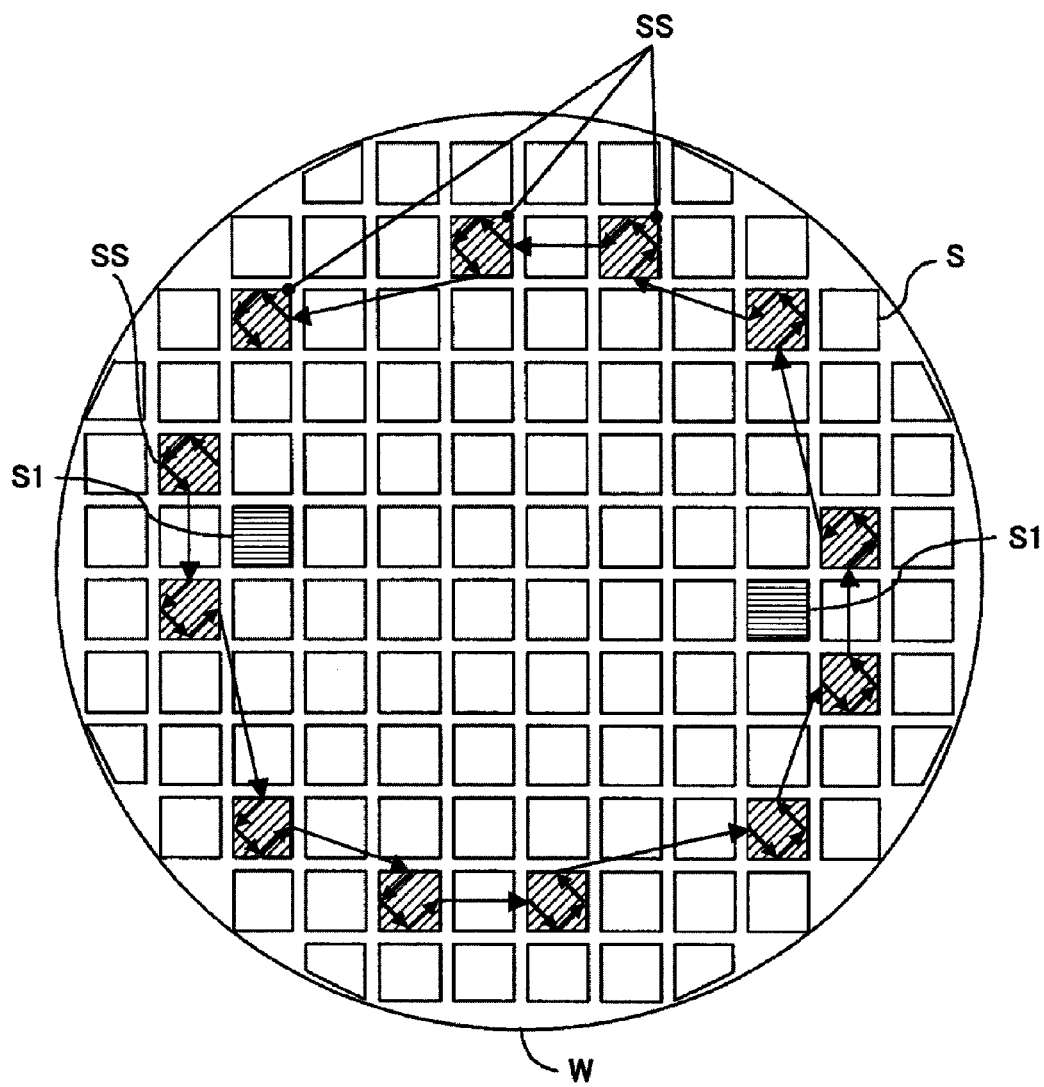
FIG. 5 is a plane view of a sample shot arrangement allocated to the shot arrangement shown in FIG. 2.

Initially, the controller 40 measures an alignment mark of the sample shot (S110). FIG. 5 is a plane view showing an arrangement of sample shots SS. The hatched sample shots SS in FIG. 5 are set to the shots S shown in FIG. 3, and shots in which positions of the alignment marks are to be measured.

Figure 6:
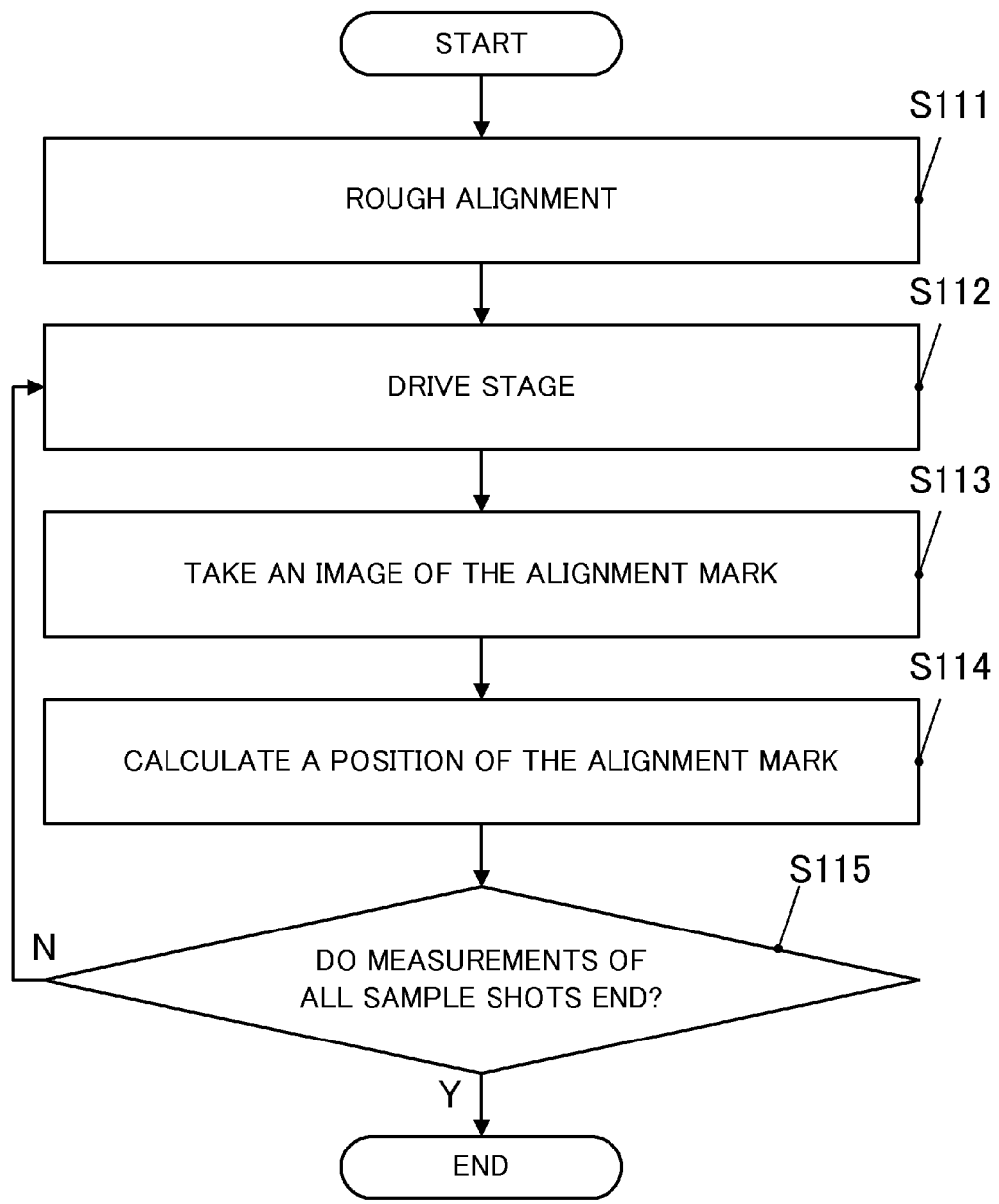
FIG. 6 is a detailed flowchart of S110 in FIG. 1.

FIG. 6 is a flowchart for explaining details of S110.

Initially, the controller 40 executes a rough alignment that measures approximate positions in the shot arrangement (S111). The rough alignment measures the sample shots fewer than the sample shots measured in the following alignment mark image pickup step and alignment mark position calculation step. The rough alignment uses a detection system having a broader field than that of the detector 14 used in the alignment mark image pickup step. For example, the alignment mark Sb shown in FIG. 4 is detected for two shots S1 shown in FIG. 5. The controller 40 drives the stage 18 based on the alignment position measured in S111 (known pattern position on the substrate).

Next, the controller 40 moves the stage 18 based on the measurement result of S111 so that the alignment mark Sc can enter the field of the detector 14 (S112).

Figure 7:
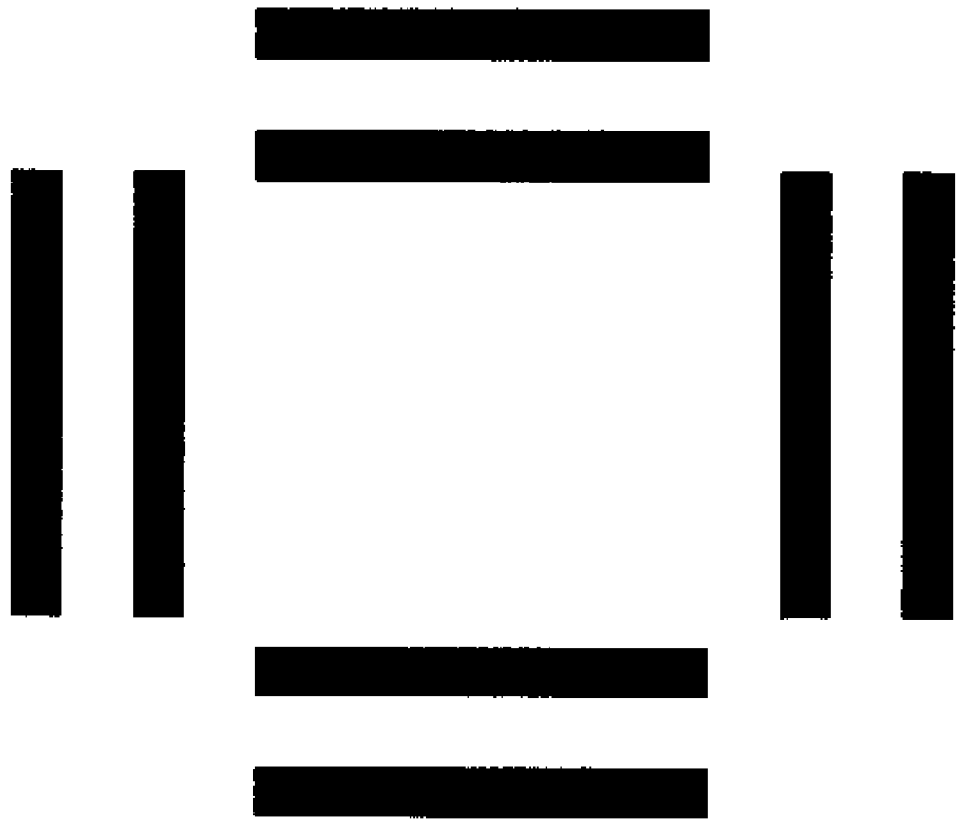
FIG. 7 is a plane view showing an image pickup result of S113 shown in FIG. 6.

Next, the controller 40 takes an image of the alignment mark Sc using the detector 14 (S113). FIG. 7 is a plane view of an image of the alignment mark Sc photographed by the detector 14.

Next, the controller 40 calculates a position of the alignment mark Sc using the known template matching method, etc. from the photographed alignment mark image (S114).

The controller 40 repeats S112 to S114 until the alignment marks Sc are measured of all sample shots (N loop of S115). An arrow of FIG. 5 denotes a movement of the field of the detector 14 on the substrate W, but the detector 14 is actually fixed and the stage 18 is moved in a direction reverse to the arrow.

When the controller 40 determines that the alignment marks Sc of all sample shots SS are measured (Y of S115), the controller 40 terminates the flow.

Turning back to FIG. 1, the controller 40 next approximates a deformation of the substrate W (substrate shape and the position and shape of the shot arrangement on the substrate) based on a measurement result of S110 (S120).

According to the conventional global alignment, this step calculates a deformation of each sample shot based on a measurement result of S110 and discards lots of information through linear approximations. On the other hand, this embodiment approximates the deformation of the substrate W based on the measurement result of S110 without calculating the deformation of each sample shot. The approximation equation is defined as a sum of a first term representative of a deformation of the entire substrate and at least one of a second term representative of a distortion of a shot arrangement and a third term representative of a distortion of a shot shape. The approximation error is thus reduced in the approximation of the deformation of the substrate by considering at least one of the second and third terms in addition to the first term. The approximation equation may be an n-th order polynomial. Since the information discarded in the approximation reduces, the approximation error can be reduced.

A description will now be given of the details of S120. This embodiment considers the substrate shape and the position and shape of the shot arrangement on the substrate to be a sum of the following three deformation factors.

The first deformation factor is a deformation of the entire substrate, such as a substrate distortion caused by a semiconductor process including a heat treatment and a Y-directional movement error of the stage 18 used in the previous step. This embodiment expresses the deformation of the entire substrate (first term) that is a first deformation factor, using as a polynomial of an arbitrary order which uses as a variation a position of a substrate coordinate that is a coordinate that expresses the entire substrate.

Initially, the deformation of the entire substrate in the X direction is expressed by the following equation:

$$a_{x1} + b_{x1}x_1 + c_{x1}y_1 + d_{x1}x_1^2 + e_{x1}x_1y_1 + f_{x1}y_1^2 + g_{x1}x_1^3 + h_{x1}x_1^2y_1 + i_{x1}x_1y_1^2 + j_{x1}y_1^3 + \ldots \quad \text{Equation 1}$$

Next, the deformation of the entire substrate in the Y direction is expressed by the following equation:

$$a_{y1}+b_{y1}x_1+c_{y1}y_1+d_{y1}x_1^2+e_{y1}x_1y_1+f_{y1}y_1^2+g_{y1}x_1^3+h_{y1}x_1^2y_1+i_{y1}x_1y_1^2+j_{y1}y_1^3+\ldots \quad \text{Equation 2}$$

Here, $(x_1, y_1)$ is a coordinate design position of the substrate coordinate. $a_{x1}, b_{x1}, c_{x1}, d_{x1}, e_{x1}, f_{x1}, g_{x1}, h_{x1}, i_{x1}$, and $j_{x1}$ are parameters (coefficients) representative of the entire substrate deformation in the X direction. $a_{y1}, b_{y1}, c_{y1}, d_{y1}, e_{y1}, f_{y1}, g_{y1}, h_{y1}, i_{y1}$, and $j_{y1}$ are parameters (coefficients) representative of the entire substrate deformation in the Y direction.

The second deformation factor is a distortion of the shot arrangement (shot arrangement deformation), such as an X-directional movement error of the stage 18 used for the previous step. The entire substrate deformation denotes a distortion of the entire substrate including the inside of each shot, whereas the shot arrangement deformation denotes a distortion of only the arrangement of the shot center positions. This embodiment expresses the distortion of the shot arrangement (second term) as a polynomial of an arbitrary order that uses the shot center position as the variation in the substrate coordinate system.

Initially, the shot arrangement deformation in the X direction is expressed as follows:

$$b_{x2}x_2+c_{x2}y_2+d_{x2}x_2^2+e_{x2}x_2y_2+f_{x2}y_2^2+g_{x2}x_2^3+h_{x2}x_2^2y_2+i_{x2}x_2y_2^2+j_{x2}y_2^3+\ldots \quad \text{Equation 3}$$

Next, the shot arrangement deformation in the Y direction is expressed as follows:

$$b_{y2}x_2+c_{y2}y_2+d_{y2}x_2^2+e_{y2}x_2y_2+f_{y2}y_2^2+g_{y2}x_2^3+h_{y2}x_2^2y_2+i_{y2}x_2y_2^2+j_{y2}y_2^3+\ldots \quad \text{Equation 4}$$

Here, $(x_2, y_2)$ is a substrate coordinate design position of a shot center. $b_{x2}, c_{x2}, d_{x2}, e_{x2}, f_{x2}, g_{x2}, h_{x2}, i_{x2}$, and $j_{x2}$ are parameters (coefficients) representative of the shot arrangement deformation in the X direction. $b_{y2}, c_{y2}, d_{y2}, e_{y2}, f_{y2}, g_{y2}, h_{y2}, i_{y2}$, and $j_{y2}$ are parameters (coefficients) representative of the shot arrangement deformation in the Y direction.

The third deformation factor is a distortion of the shot shape (shot shape deformation), such as a movement error of the original stage 24 used for the previous step, the alignment error of the original M, the deformation of the original M, and the distortion of the projection optical system 26. This embodiment expresses the shot shape deformation (third term) as a polynomial of an arbitrary order that uses as a variation a position in the shot coordinate system as the coordinate system for each shot.

Initially, the shot shape deformation in the X direction is expressed as follows:

$$B_xX+C_xY+D_xX^2+E_xXY+F_xY^2+G_xX^3+H_xX^2Y+I_xXY^2+J_xY^3+\ldots \quad \text{Equation 5}$$

Initially, the shot shape deformation in the Y direction is expressed as follows:

$$B_yX+C_yY+D_yX^2+E_yXY+F_yY^2+G_yX^3+H_yX^2Y+I_yXY^2+J_yY^3+\ldots \quad \text{Equation 6}$$

Here, $(X, Y)$ is a shot coordinate design position. $B_x, C_x, D_x, E_x, F_x, G_x, H_x, I_x$, and $J_x$ are parameters (coefficients) representative of the shot arrangement deformation in the X direction. $B_y, C_y, D_y, E_y, F_y, G_y, H_y, I_y$, and $J_y$ are parameters (coefficients) representative of the shot arrangement deformation in the Y direction.

A position and shape of the known pattern are calculated from an equation that sums up these three deformation factors. The following equations represent a post-deformation position, where $(x_1, y_1)$ denotes a design position of the substrate coordinate, $(x_2, x_2)$ denotes a substrate coordinate design position of the shot center, and $(X, Y)$ denotes the shot coordinate design position.

Initially, the post-deformation substrate coordinate position $p_x(x_1, y_1, x_2, y_2, X, Y)$ in the X direction is expressed as follows:

$$p_x(x_1,y_1,x_2,y_2,X,Y)=a_{x1}+b_{x1}x_1+c_{x1}y_1+d_{x1}x_1^2+e_{x1}x_1y_1+f_{x1}y_1^2+g_{x1}x_1^3+h_{x1}x_1^2y_1+i_{x1}x_1y_1^2+j_{x1}y_1^3\ldots$$
$$+b_{x2}x_2+c_{x2}y_2+d_{x2}x_2^2+e_{x2}x_2y_2+f_{x2}y_2^2+g_{x2}x_2^3+h_{x2}x_2^2y_2+i_{x2}x_2y_2^2+j_{x2}y_2^3+\ldots B_xX+C_xY+D_xX^2+E_xXY+F_xY^2+G_xX^3+H_xX^2Y+G_xX^3+Y+I_xXY^2+J_xY^3+\ldots \quad \text{Equation 7}$$

Next, the post-deformation substrate coordinate position $p_y(x_1, y_1, x_2, y_2, X, Y)$ in the Y direction is expressed as follows:

$$p_y(x_1,y_1,x_2,y_2,X,Y)=a_{y1}+b_{y1}x_1+c_{y1}y_1+d_{y1}x_1^2+e_{y1}x_1y_1+f_{y1}y_1^2+g_{y1}x_1^3+h_{y1}x_1^2y_1+i_{y1}x_1y_1^2+j_{y1}y_1^3+\ldots$$
$$+b_{y2}x_2+c_{y2}y_2+d_{y2}x_2^2+e_{y2}x_2y_2+f_{y2}y_2^2+g_{y2}x_2^3+h_{y2}x_2^2y_2+i_{y2}x_2y_2^2+j_{y2}y_2^3+\ldots B_yX+C_yY+D_yX^2+E_yXY+F_yY^2+G_yX^3+H_yX^2Y+I_yXY^2+J_yY^3+\ldots \quad \text{Equation 8}$$

The memory 42 stores the Equations 7 and 8, and the measurement result of S110.

Px and Py of the Equations 7 and 8 are calculated utilizing the measurement result of S110. More specifically, coefficients in each equation are calculated. The coefficient $a_{x1}$ to $j_{x1}$, $a_{y1}$ to $j_{y1}$, $b_{x2}$ to $j_{x2}$, $b_{y2}$ to $j_{y2}$, $B_x$ to $J_x$, and $B_x$ to $J_x$ are calculated from the measurement position of each alignment mark Sc of the sample shot SS. More specifically, they are calculated by using the design position $(x_1, y_1)$ of the substrate coordinate of each alignment mark Sc, the substrate coordinate design position $(x_2, y_2)$ of the shot center, the shot coordinate design position $(X, Y)$, and the measurement position $(p_x, p_y)$ as the post-deformation substrate coordinate position. This equation can be calculated by solving the normal equation using the least squares approximation method. A solution of the normal equation can use the LU decomposition.

The Equations 7 and 8 as general equations use polynomials having arbitrary orders, but may use a polynomial having a specific order based on the known pattern of the substrate W and a polynomial that has no specific term in the enforcement. Hence, the equations 7 and 8 are determined in advance.

Figure 8:
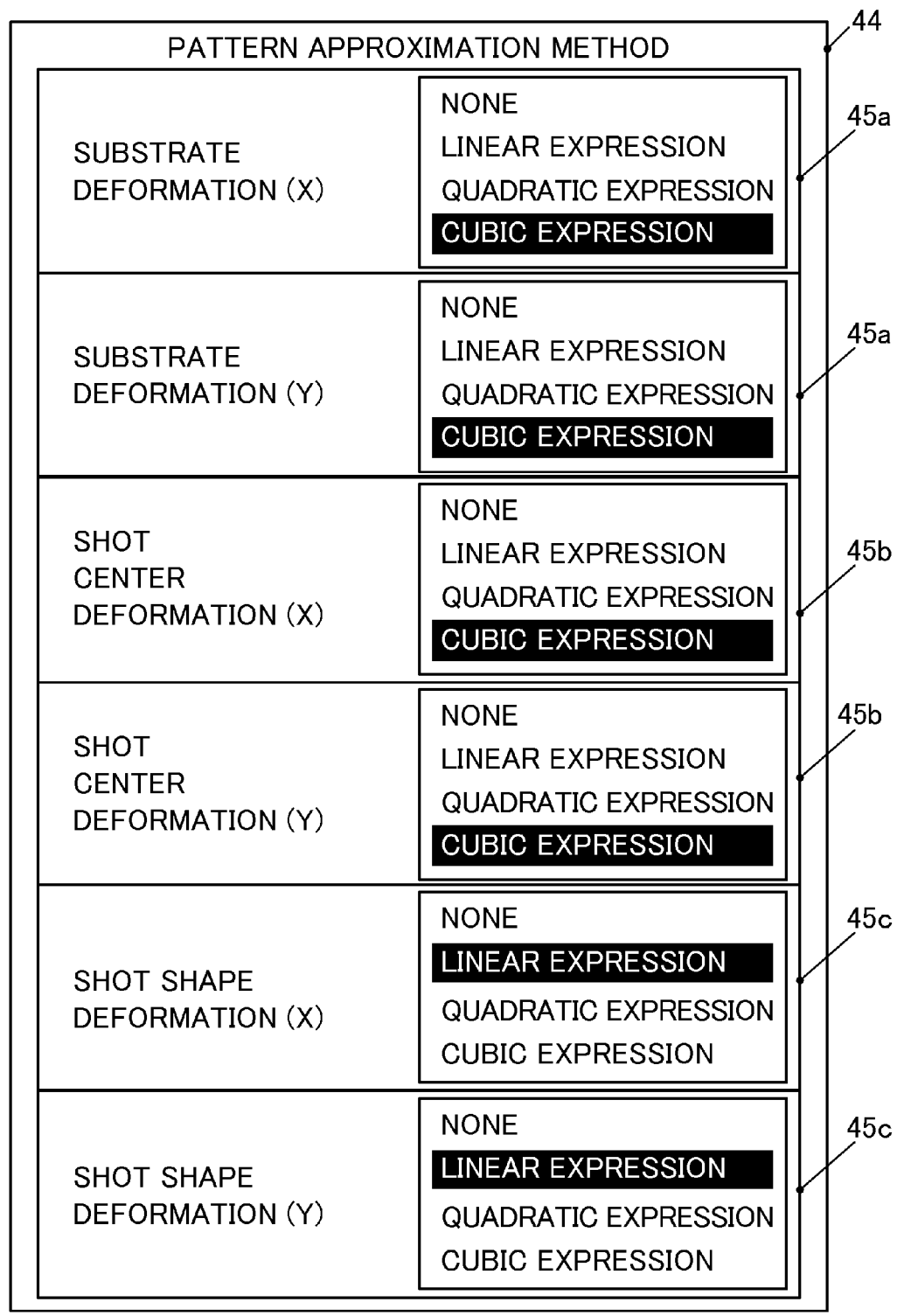
FIG. 8 is an operation screen used to set an order of each term in an approximation equation used to approximate a deformation of the substrate according to the first embodiment.

FIG. 8 is a plane view showing one illustrative operation screen of the display 44 used to set the order of each of the first to third terms. The user can input the order of the equations 7 and 8 via the input unit 48. A field 45a is a section used to determine the order of the entire substrate deformation that is the first deformation factor. A field 45b is a section used to set the shot arrangement deformation that is the second deformation factor. A field 45c is a section used to set the shot shape deformation that is the third deformation factor. The order of the polynomial to be used can be previously set through the operation screen.

Next, the correction amounts of each of all shots S on the substrate W are calculated based on the Equations 7 and 8 obtained in S120 (S130). The conventional global alignment relies on the deformation of each sample shot so as to calculate the correction amounts of all shots S on the substrate W, whereas this embodiment relies upon the deformation of the entire substrate. As described above, the deformation of each sample shot is conventionally expressed as information approximated by a linear equation whereas this embodiment uses information approximated by a polynomial of a high order higher than a first order. Thus, less information is discarded in the approximation and the approximation error is reduced. In addition, the prior art does not consider any deformation factor whereas this embodiment considers at least two of three deformation factors, such as first term and second term, the first term and third term, and all of the first, second, and third terms. Therefore, even when the linear equation is selected in FIG. 8 for each of all deformation factors, the approximation error is less than that of the prior art.

While this embodiment describes that the exposure apparatus exposes while correcting a linear component of a shot shape, but the present invention can be expanded to a method for correcting a component of an arbitrary order of the shot shape. This embodiment sets a plurality of sample points to a shot, and calculates a shape of each shot by solving the following equations from a design value of each sample point and a position calculated by the Equations 7 and 8:

$$P_x(X,Y) = S_x[i] + M_x[i]X + R_x[i]Y \qquad \text{Equation 9}$$

$$P_y(X,Y) = S_y[i] + R_y[i]X + M_y[i]Y \qquad \text{Equation 10}$$

Here, (X, Y) is a shot coordinate design position. ($P_x$, $P_y$) is a post-deformation shot coordinate position. $S_x[i]$ is an X-directional shot center position (shift) of a shot "i," and $S_y[i]$ is a Y-directional shot center position (shift) of the shot "i." $M_x[i]$ is an X-directional shot magnification of the shot "i," and $M_y[i]$ is a Y-directional shot magnification of the shot "i." $R_x[i]$ is an X-directional shot rotation of the shot "i," and $R_y[i]$ is a Y-directional shot rotation of the shot "i."

The coefficients of the Equations 9 and 10 are calculated for each shot from the shot coordinate design position of the shot's sample points and the post-deformation shot coordinate position calculated from the Equations 7 and 8. More specifically, the sample points are set uniformly in the shot, and the post-deformation shot coordinate position is calculated from the Equations 7 and 8 for each of the sample shot. Next, $S_x[i]$, $S_y[i]$, $M_x[i]$, $M_y[i]$, $R_x[i]$, and $R_y[i]$ are calculated from the shot coordinate design position (X, Y) of the sample points and the post-deformation shot coordinate position ($P_x$, $P_y$). This equation can be calculated by solving the normal equation using the least squares approximation method. A solution of the normal equation can use the LU decomposition.

After the exposure position and shape (shift, magnification, and rotation) of each shot are calculated by the above method, they are corrected at the exposure time (S140). More specifically, the controller 40 drives the stage 28 and corrects the shift of each shot S. Next, the controller 40 corrects the shot magnification of each shot S by the projection magnification correction means configured to drive the floatation lens in the projection optical system 26 in the longitudinal direction. Next, the controller 40 corrects the shot rotation of each shot S by means for correcting a distortion by changing a relative position of a pair of optical elements having an aspheric surface having the same shape in the projection optical system 26. Next, the controller corrects the shot rotation of each shot by the skew correction means configured to relatively adjust the scanning directions of the original stage 24 and the stage 28. Next, the controller 40 corrects the shot magnification in the scanning direction of each shot S by the distortion correction means configured to adjust the scanning velocity of the stage.

The quadratic or higher correction values can be corrected, for example, by changing the scanning directions of the original stage 24 and the stage 28 using the locus having an arbitrary order. Moreover, the shot position and shape are approximated using a polynomial so as to calculate a correction value, but the correction value may be calculated from a variation amount at a position of the post-deformation substrate coordinate. This method can calculate the correction value faster than the approximation method using the polynomial. More specifically, in the following equations, a design value at the substrate coordinate at each shot center is substituted for ($x_1$, $y_1$), a shot center position design value in the substrate coordinate is substituted for ($x_2$, $y_2$), and a shot center position design value (0, 0) in the shot coordinate is substituted for (X, Y).

$$S_x = p_x(x_1, y_1, x_2, y_2, X, Y) \qquad \text{Equation 11}$$

$$S_y = p_y(x_1, y_1, x_2, y_2, X, Y) \qquad \text{Equation 12}$$

$$M_x = \frac{d p_x(x_1, y_1, x_2, y_2, X, Y)}{dx_1} + \frac{d p_x(x_1, y_1, x_2, y_2, X, Y)}{dx_2} + \frac{d p_x(x_1, y_1, x_2, y_2, X, Y)}{dX} \qquad \text{Equation 13}$$

$$M_y = \frac{d p_y(x_1, y_1, x_2, y_2, X, Y)}{dy_1} + \frac{d p_y(x_1, y_1, x_2, y_2, X, Y)}{dy_2} + \frac{d p_y(x_1, y_1, x_2, y_2, X, Y)}{dY} \qquad \text{Equation 14}$$

$$R_x = \frac{d p_x(x_1, y_1, x_2, y_2, X, Y)}{dy_1} + \frac{d p_x(x_1, y_1, x_2, y_2, X, Y)}{dy_2} + \frac{d p_x(x_1, y_1, x_2, y_2, X, Y)}{dY} \qquad \text{Equation 15}$$

$$R_y = \frac{d p_y(x_1, y_1, x_2, y_2, X, Y)}{dx_1} + \frac{d p_y(x_1, y_1, x_2, y_2, X, Y)}{dx_2} + \frac{d p_y(x_1, y_1, x_2, y_2, X, Y)}{dX} \qquad \text{Equation 16}$$

Next follows a description of an embodiment in which the controller 40 sets the sample shots SS around the outer circumference of the substrate W. The conventional sample shots SS are often arranged at regular intervals and symmetrically with respect to the substrate center, as shown in FIG. 5. On the other hand, since the substrate is likely to distort as a position is closer to the outer circumference due to the process influence, it is advantageous to set the sample shots in the periphery of the substrate. The prior art cannot use a partially chipped shot for the sample shot.

Figure 9:
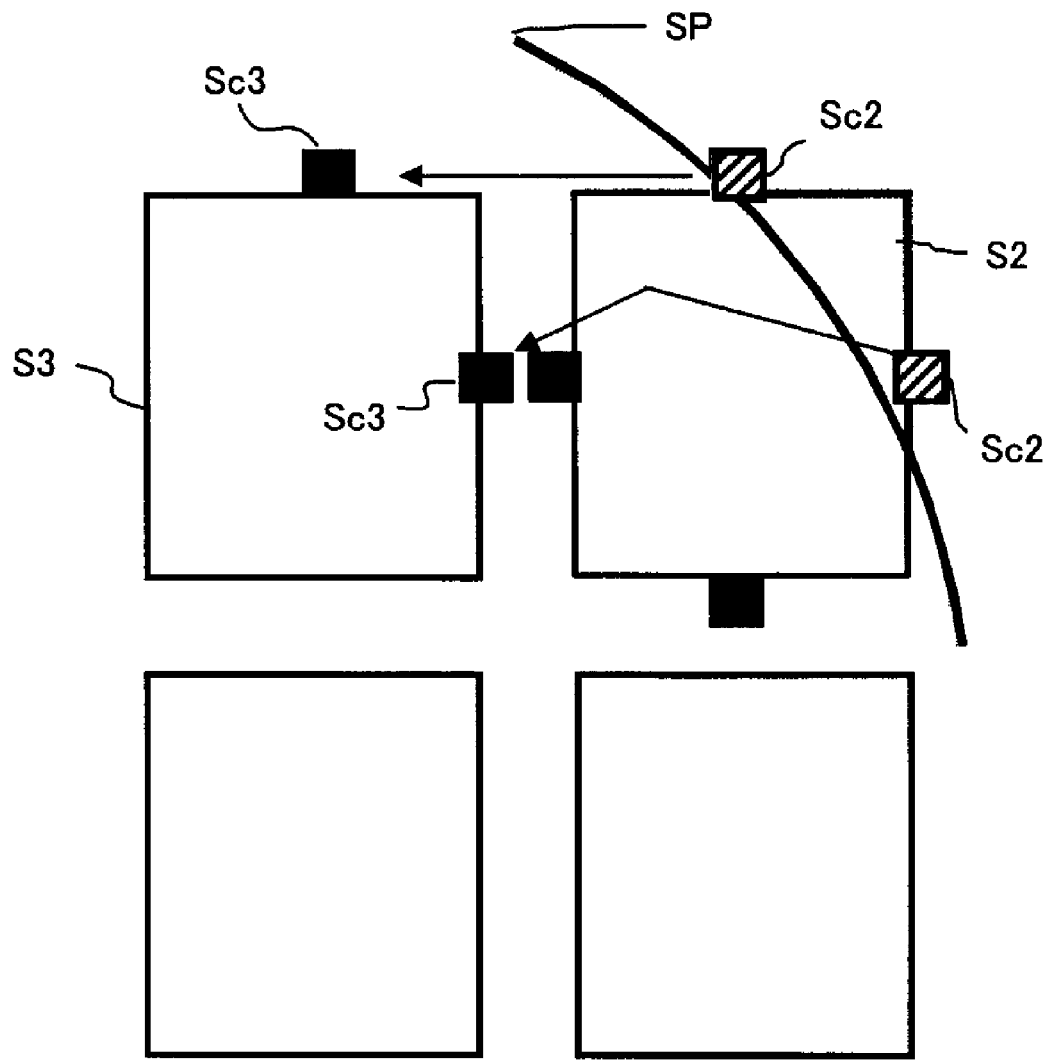
FIG. 9 is a plane view of the sample shots set around the outer circumference of the substrate.

FIG. 9 is a schematic plane view showing illustrative sample shots set to the periphery of the substrate. Since this embodiment has no process to calculate a deformation of each sample shot, this embodiment can use a partially chipped shot for the sample shot. Thus, measurement points are set to the shots in the outer circumference of the substrate including adjacent shots, as shown in FIG. 9.

In FIG. 9, SP denotes a contour of the substrate, S2 is a peripheral shot of the substrate, Sc2 denotes an alignment mark that cannot be measured in the peripheral shot S2 of the substrate, S3 denotes a shot adjacent to the shot S2, and Sc3 is an alignment mark to be measured instead of the alignment mark Sc2. When both the shots S2 and S3 are allocated to the sample shots, the sample shot (measurement point) can be set to the peripheral of the substrate.

Figure 10:
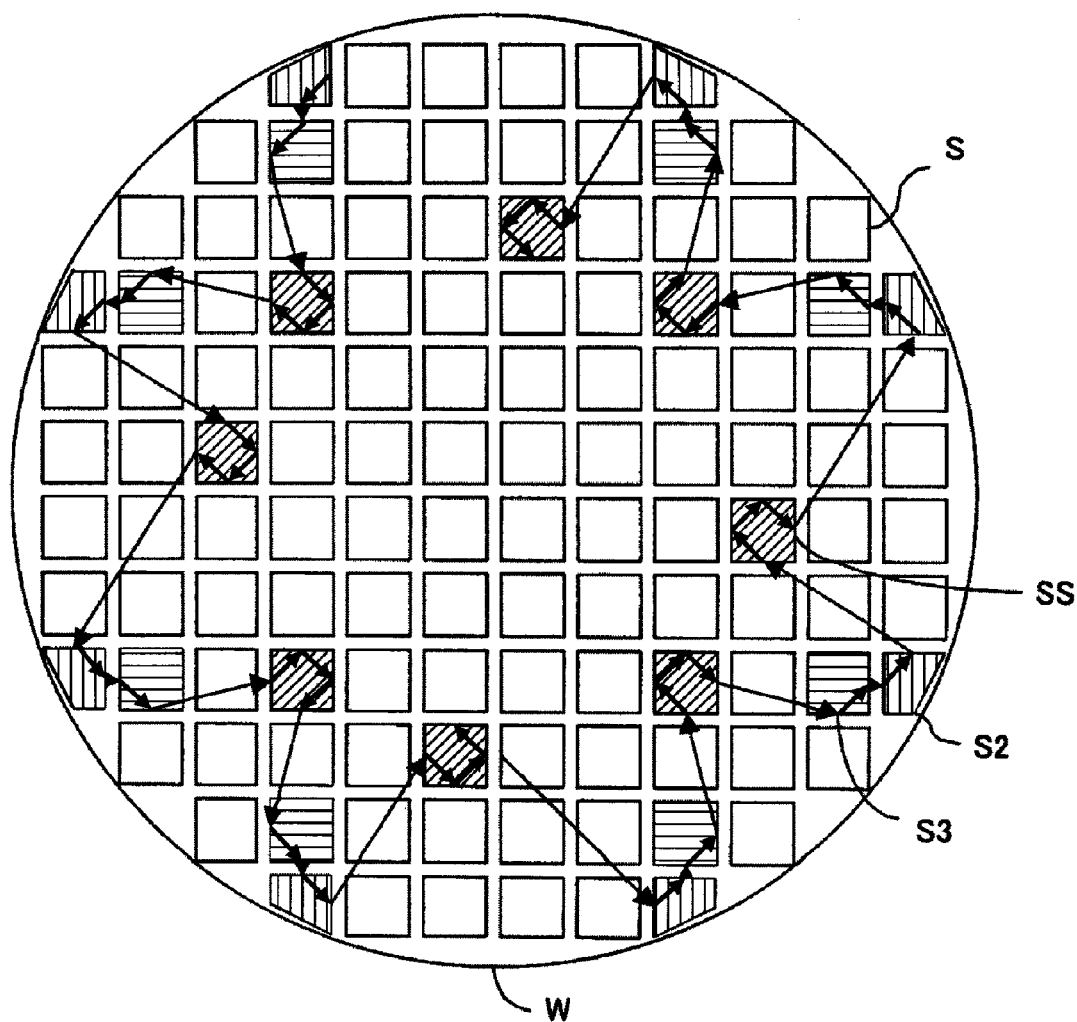
FIG. 10 is a plane view of a variation of FIG. 5.

FIG. 10 is a plane view showing an illustrative sample shot arrangement including the sample shots set in FIG. 9. Since the sample shots can be fully set around the outer circumference of the substrate and inside of the substrate, an improvement of the alignment precision can be expected.

Next follows a process when the alignment mark cannot be measured due to chipping. The alignment mark on the substrate may chip in the process. In this case, the process may continue by measuring another alignment mark of that shot. However, when one alignment mark cannot be measured in the conventional sample shot, the other alignment mark is also unavailable in that sample shot and it is necessary to measure the same number of alignment marks in another new sample shot.

Figure 11:
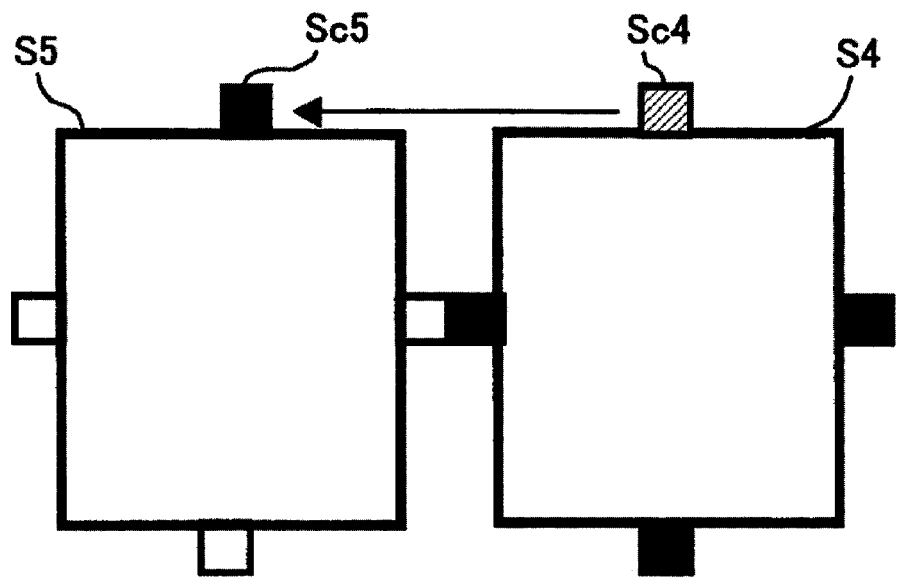
FIG. 11 is a schematic plane view for explaining an alternative of the alignment mark to be measured.

On the other hand, this embodiment has no process to calculate the deformation of each sample shot. When an alignment mark Sc4 of a shot S4 cannot be measured, the detector 14 may measure an alignment mark Sc5 of an adjacent shot S5, as shown in FIG. 11. Thereby, it is possible to restrain an increase of the processing time which occurs when the alignment mark cannot be measured.

The alignment method of the first embodiment does not provide an approximation into the linear component, and can reduce the approximation error. In addition, the alignment method of this embodiment does not need to calculate a deformation of each sample shot, and thus can set the sample shots in the peripheral of the substrate. Even when an alignment mark cannot be measured, an alignment mark in the adjacent shot is used for the measurement as an alternative. Moreover, mere changing of a model can provide a calculation of the shot shape having quadratic or higher components, and the alignment method of this embodiment is superior to the extendability.

Second Embodiment

The second embodiment changes an approximation equation used to approximate the substrate W based on an exposure method of the exposure apparatus that has previously exposed the pattern onto the substrate W that is an object of the overlay. The exposure apparatus of the second embodiment is similar to that of the first embodiment. In other words, this embodiment uses equations different from the Equations 7 and 8 for the equations representative of the post-deformation substrate coordinate position.

Figures 12A, 12B, 12C:
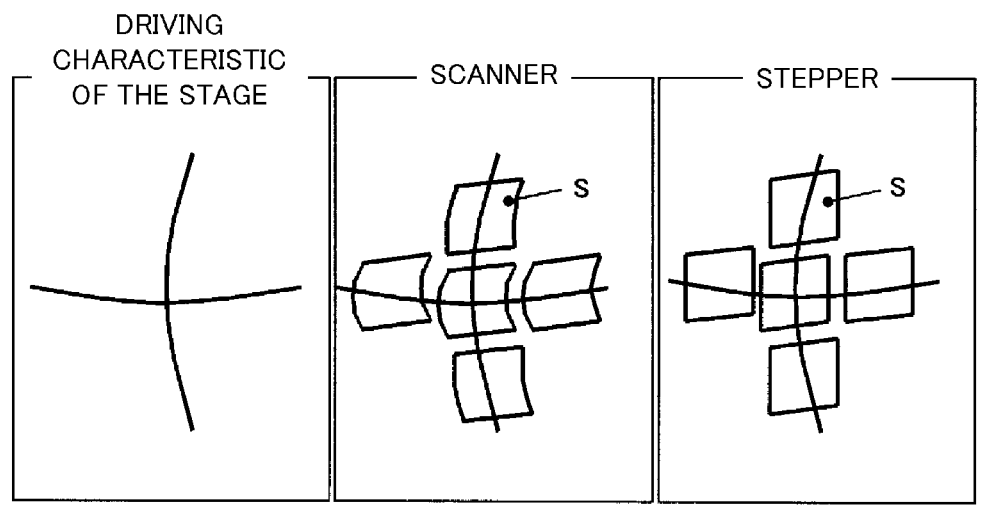
FIGS. 12A-12C are schematic plane views for explaining that the deformations of the shots differ according to the exposure method.

The shot deformation differs according to the exposure method. More specifically, since the stage is stationary at the exposure time in the step-and-repeat exposure apparatus (stepper), the driving characteristic of the stage is not influenced by the shot shape (although it is affected by the distribution of the center position between the shots). On the other hand, since the stage moves at the exposure time in the step-and-scan exposure apparatus (scanner), the driving characteristic of the stage 28 is affected by the shot shape. For example, when the driving characteristic of the stage is expressed as shown in FIG. 12A, the shot shape becomes as shown in FIG. 12B in the exposure by the scanner and the shot shape becomes as shown in FIG. 12C in the exposure by the stepper. This embodiment uses a pattern deformation model that depends upon a difference of the shot shape due to the exposure method of the exposure apparatus.

A stage driving error is the first deformation factor when the scanner exposes the known pattern, and it is the second deformation factor in the stepper. Thereby, the following polynomials are used according to the exposure method of the exposure apparatus that has exposed the known pattern:

The following equations are used when the scanner exposes the known pattern:

$$P_x(x_1,y_1,x_2,y_2,X,Y)=a_{x1}+b_{x1}x_1+c_{x1}y_1+d_{x1}x_1^2+e_{x1}x_1y_1+f_{x1}y_1^2+g_{x1}x_1^3+h_{x1}x_1^2y_1+i_{x1}x_1y_1^2+j_{x1}y_1^3+\ldots\\b_{x2}x_2+c_{x2}y_2+d_{x2}x_2^2+e_{x2}x_2y_2+f_{x2}y_2^2+g_{x2}x_2^3+\\h_{x2}x_2^2y_2+i_{x2}x_2y_2^2+j_{x2}y_2^3+\ldots B_xX+C_xY+D_xX^2+\\E_xXY+F_xY^2+G_xX^3+H_xX^2Y+I_xXY^2+J_xY^3+\ldots$$ Equation 17

$$P_y(x_1,y_1,x_2,y_2,X,Y)=a_{y1}+b_{y1}x_1+c_{y1}y_1+d_{y1}x_1^2+e_{y1}x_1y_1+f_{y1}y_1^2+g_{y1}x_1^3+h_{y1}x_1^2y_1+i_{y1}x_1y_1^2+j_{y1}y_1^3+\ldots\\B_yX+C_yY+D_yX^2+E_yXY+F_yY^2+G_yX^3+H_yX^2Y+\\I_yXY^2+J_yY^3+\ldots$$ Equation 18

When the stepper exposes the known pattern, the following equations are used:

$$P_x(x_1,y_1,x_2,y_2,X,Y)=a_{x1}+b_{x1}x_1+c_{x1}y_1+d_{x1}x_1^2+e_{x1}x_1y_1+f_{x1}y_1^2+g_{x1}x_1^3+h_{x1}x_1^2y_1+i_{x1}x_1y_1^2+j_{x1}y_1^3+\ldots\\b_{x2}x_2+c_{x2}y_2+d_{x2}x_2^2+e_{x2}x_2y_2+f_{x2}y_2^2+g_{x2}x_2^3+\\h_{x2}x_2^2y_2+i_{x2}x_2y_2^2+j_{x2}y_2^3+\ldots B_xX+C_xY+D_xX^2+\\E_xXY+F_xY^2+G_xX^3+H_xX^2Y+I_xXY^2+J_xY^3+\ldots$$ Equation 19

$$P_y(x_1,y_1,x_2,y_2,X,Y)=a_{y1}+b_{y1}x_1+c_{y1}y_1+d_{y1}x_1^2+e_{y1}x_1y_1+f_{y1}y_1^2+g_{y1}x_1^3+h_{y1}x_1^2y_1+i_{y1}x_1y_1^2+j_{y1}y_1^3+\ldots\\b_{y2}x_2+c_{y2}y_2+d_{y2}x_2^2+e_{y2}x_2y_2+f_{y2}y_2^2+g_{y2}x_2^3+\\h_{y2}x_2^2y_2+i_{y2}x_2y_2^2+j_{y2}y_2^3+\ldots B_yX+C_yY+D_yX^2+\\E_yXY+F_yY^2+G_yX^3+H_yX^2Y+I_yXY^2+J_yY^3+\ldots$$ Equation 20

Figure 13:
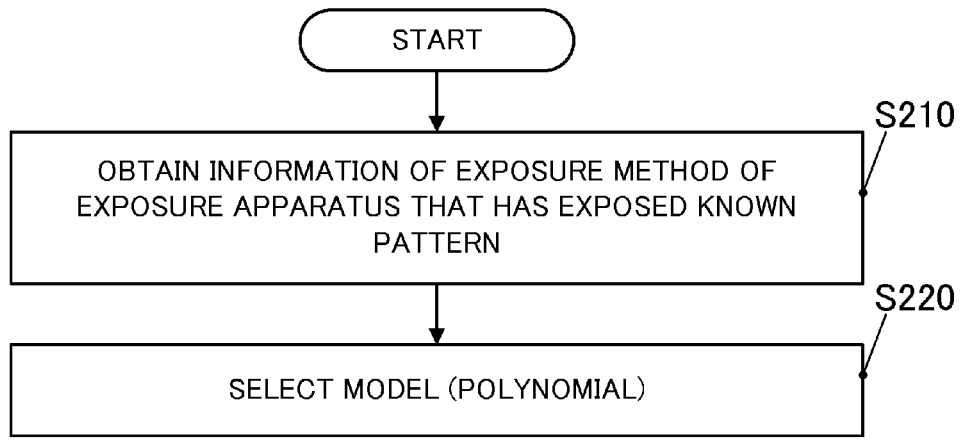
FIG. 13 is a flowchart for explaining an alignment method according to a second embodiment.

FIG. 13 is a flowchart for explaining a method for selecting a model (polynomial).

Figure 14:
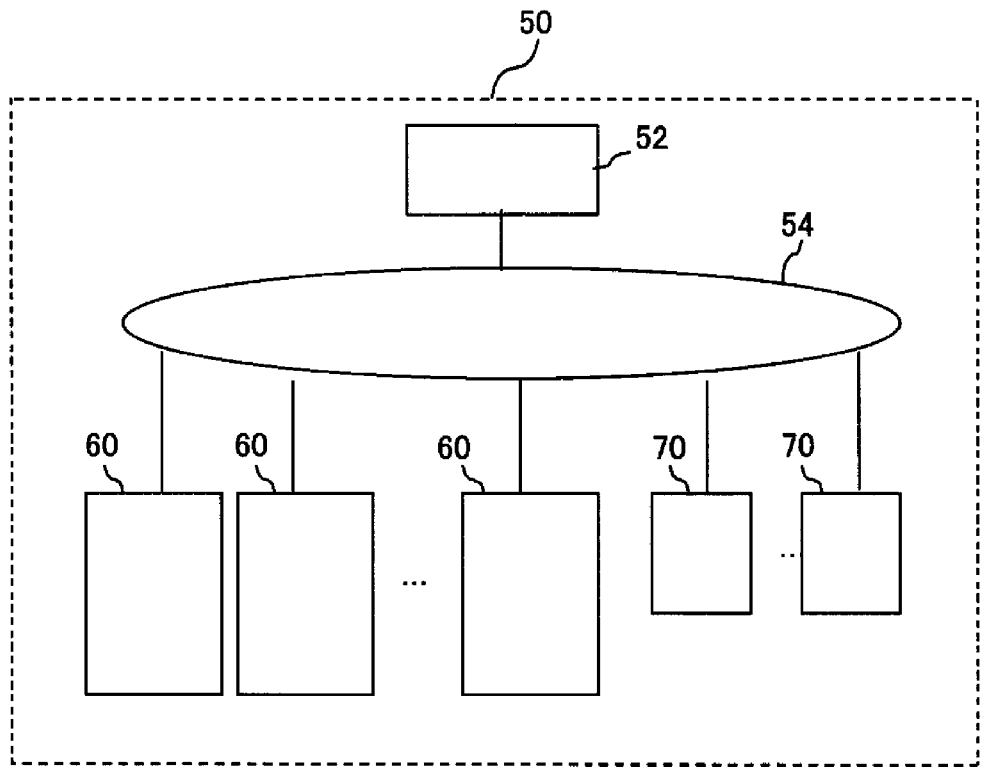
FIG. 14 is a block diagram of a factory equipped with a plurality of exposure apparatuses.

Initially, the controller 40 obtains an exposure method of the exposure apparatus that exposes the known pattern (S210). FIG. 14 is a typical block diagram of a factory 50 that manufactures a substrate. The factory 50 has a host computer connected to a plurality of exposure apparatuses 60 and other substrate manufacturing apparatuses 70 via a communication network 54, and the host computer 52 controls each manufacturing apparatus so as to manufacture a semiconductor device. Thus, the host computer 52 manages the exposure apparatus that has exposed the known pattern (a layer that is an object of an overlay) and its exposure method. S210 refers to the exposure method of the exposure apparatus that has exposed the known pattern by inquiring the host computer 52.

Next, in S220, the controller 40 selects a model (polynomial) in accordance with the result of S210. For example, the controller 40 selects the Equations 17 and 18 when the exposure apparatus that has exposed the known pattern is a scanner, and the Equations 19 and 20 when the exposure apparatus is a stepper. Similar to the first embodiment, the order of the Equations 17 to 20 can be specified and the specific term may be excluded.

FIG. 15 is one illustrative operation screen of the display 44. The user can set the order of the Equations 17 to 20 via the input unit 48. A field 46a is a section used to determine the order of the entire substrate deformation that is the first deformation factor. A field 46b is a section used to set the shot arrangement deformation that is the second deformation factor. A field 46c is a section used to set the shot shape deformation that is the third deformation factor. The order of the polynomial to be used can be set in advance through the operation screen.

The second embodiment selects the model (polynomial) in accordance with a type of the exposure apparatus that has exposed the known pattern, thereby improving the approximation precision and providing precise overlay. In addition, the model (polynomial) having the small number of coefficients to be calculated can be used, and the processing time can be shortened.

In exposure, while the exposure station 20 exposes the substrate W, the measurement station 10 measures another substrate W. After each operation ends, the substrate W that has been exposed is exhausted from the exposure station 20 and the other substrate W in the measurement station 10 is supplied to the exposure station 20 by the stage 18. The controller 40 exposes the other substrate W based on information of the measurement result of the measurement station 10. Still another substrate is supplied to the measurement station 10. Since the alignment precision improves in this embodiment, the exposure apparatus can provide exposures with good overlay accuracy.

A method of manufacturing a device, such as a semiconductor integrated circuit device and a liquid crystal display device, includes the step of exposing the photosensitive agent applied substrate, such as a wafer and a glass plate, using the above exposure apparatus, the step of developing the substrate, and the other well-known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-271783, filed Oct. 22, 2008, which is hereby incorporated by reference herein in its entirety.

What is claimed is:

1. An exposure apparatus configured to expose an image of a pattern of an original onto each of a plurality of shots as a plurality of transfer areas on a substrate, said exposure apparatus comprising:
 a stage configured to support and drive the substrate;
 a detector configured to detect an alignment mark provided to each of a plurality of sample shots allocated to the plurality of shots; and
 a controller configured to calculate a position of the alignment mark detected by the detector, to approximate a deformation of the substrate using an approximation equation, to calculate a correction amount of each of the plurality of shots, and to control driving of the stage in exposing each shot based on a correction amount that is calculated, the approximation equation being defined as a sum of a first term representative of a deformation of an entire substrate using a position on the substrate as variables and at least one of a second term representative of a distortion of a shot arrangement using a shot center position on the substrate as variables or a third term representative of a shot shape using a position in a coordinate system for each shot as variables.

2. The exposure apparatus according to claim 1, wherein the approximation equation is an n-th order polynomial, where n represents a positive integer.

3. The exposure apparatus according to claim 1, further comprising:
 a display configured to display an operation screen used to set an order of each of the first term and at least one of the second term or the third term; and
 an input unit configured to input the order of each of the first term and at least one of the second term the or third term.

4. The exposure apparatus according to claim 1, wherein the controller sets the plurality of sample shots to shots in a peripheral of the substrate.

5. The exposure apparatus according to claim 1, wherein the detector detects an alignment mark of a shot adjacent to a sample shot when the alignment mark of a sample shot cannot be measured.

6. The exposure apparatus according to claim 1, wherein the controller changes the approximation equation used to approximate the deformation of the substrate, based on an exposure method of the exposure apparatus that has previously exposed the substrate.

7. A device manufacturing method comprising the steps of:
 exposing a substrate using an exposure apparatus configured to expose an image of a pattern of an original onto each of a plurality of shots as a plurality of transfer areas on a substrate; and
 developing the substrate that has been exposed,
 wherein the exposure apparatus includes:
 a stage configured to support and drive the substrate;
 a detector configured to detect an alignment mark provided to each of a plurality of sample shots allocated to the plurality of shots; and
 a controller configured to calculate a position of the alignment mark detected by the detector, to approximate a deformation of the substrate using an approximation equation, to calculate a correction amount of each of the plurality of shots, and to control driving of the stage in exposing each shot based on a correction amount that is calculated, the approximation equation being defined as a sum of a first term representative of a deformation of an entire substrate using a position on the substrate as variables and at least one of a second term representative of a distortion of a shot arrangement using a shot center position on the substrate as variables or a third term representative of a shot shape using a position in a coordinate system for each shot as variables.

8. An exposure method configured to expose an image of a pattern of an original onto each of a plurality of shots as a plurality of transfer areas on a substrate supported on a stage configured to drive the substrate, said exposure method comprising the steps of:
 calculating a position of an alignment mark by detecting using a detector the alignment mark that is provided to each of a plurality of sample shots allocated to the plurality of shots;
 approximating a deformation of the substrate by using an approximation equation that is defined as a sum of a first term representative of a deformation of an entire substrate using a position on the substrate as variables and at least one of a second term representative of a distortion of a shot arrangement using a shot center position on the substrate as variables or a third term representative of a shot shape using a position in a coordinate system for each shot as variables; and
 calculating a correction amount of each of the plurality of shots based on a result of the approximating step; and
 controlling driving of the stage at an exposure time based on the correction amount calculated by the calculating step.

* * * * *